United States Patent [19]

Jackson

[11] Patent Number: 4,574,462
[45] Date of Patent: Mar. 11, 1986

[54] SENSOR FOR CUT-CLINCH HEAD ASSEMBLY

[75] Inventor: Rodney P. Jackson, Auburn, N.H.

[73] Assignee: USM Corporation, Farmington, Conn.

[21] Appl. No.: 635,629

[22] Filed: Jul. 30, 1984

[51] Int. Cl.$^4$ .......................... H05K 3/30; B21F 11/00
[52] U.S. Cl. .................................. 29/566.3; 29/564.8; 29/715; 140/105; 227/79
[58] Field of Search .................. 29/715, 564.8, 566.3, 29/566, 741, 33 M, 837, 838, 884, 709, 710, 721; 140/930, 105; 227/2, 79

[56] References Cited

U.S. PATENT DOCUMENTS

| | | | |
|---|---|---|---|
| 4,058,881 | 11/1977 | Gavin et al. | 29/715 |
| 4,165,557 | 8/1979 | Taguchi et al. | 29/715 X |
| 4,178,679 | 12/1979 | Lichtenstein | 29/715 |
| 4,218,817 | 8/1980 | Takano | 29/715 X |
| 4,288,914 | 9/1981 | Vancelette | 140/105 X |
| 4,292,727 | 10/1981 | Maxner | 29/715 X |
| 4,309,808 | 1/1982 | Dean et al. | 29/715 X |
| 4,403,406 | 9/1983 | Foley | 29/721 |
| 4,485,548 | 12/1984 | Janisiewieck | 29/566.3 |

*Primary Examiner*—Gil Weidenfeld
*Assistant Examiner*—Glenn L. Webb
*Attorney, Agent, or Firm*—Alan N. McCartney

[57] ABSTRACT

A head assembly for a cut-clinch mechanism that cuts and forms lead wires of an electrical component that extend down through openings in a printed circuit board. The assembly has a fixed knife and a movable knife driven by a pneumatic cylinder into cutting relationship with the fixed knife. The drive has a piston which encloses an electrical contact responsive to contact of the movable knife with a lead wire to signal the presence of the lead wire. The electrical contact is adjustable to fine tune the sensor.

2 Claims, 5 Drawing Figures

SENSOR FOR CUT-CLINCH HEAD ASSEMBLY

BACKGROUND OF THE INVENTION (1) Field of the Invention

An improved sensor to indicate that an electrical component lead is present in a cut-clinch head assembly of an electrical component assembly machine.

(2) Summary of the Prior Art

In assembling axial lead electrical components to printed circuit boards, the component lead wires are inserted down through predetermined openings in the printed circuit boards. Thereafter, a cut-clinch mechanism, located beneath the board, cuts and bends over or clinches the lead wires to the underside of the board to securely attach the component of the board. This permits the board to be handled during the remaining assembly operations prior to permanently attaching the components to the board by way soldering, for example.

In such a lead wire cutting and clinching operation, it is desirable to known whether the lead wire is properly positioned through the board opening and whether the lead wire is properly positioned in the cut-clinch head to indicate to the machine control that the cut-clinch mechanism can continue to operate.

The U.S. Pat. No. 4,292,727 to Maxner, illustrates a cut-clinch mechanism in which the cut-clinch knife is caused to move in response to the presence of a component lead wire to trigger a signal that the lead wire is present in the cut-clinch head. The U.S. Pat. No. 4,165,557 to Taguchi et al discloses a sensing mechanism for detecting whether the lead wire is disposed within the cut-clinch head.

None of the prior art, however, disclose a sensing mechanism that is completely enclosed in the cut-clinch head assembly and is adjustable to fine tune the sensor to assure accurate and continuous sensing of the presence of the component lead wire in the head assembly.

BRIEF SUMMARY OF THE INVENTION

According to the present invention, a cut-clinch head assembly has a fixed knife and a movable knife with means to drive the movable knife into contact with the fixed knife to sever and bend over the lead wire of an electrical component to secure the component to a printed circuit board. The movable knife is mounted to a movable carrier housed within a piston rod carried within a pneumatic cylinder. The contact of the movable knife with the component lead will cause a ball plunger in the carrier to engage an electrical contact fixed within the piston rod. The engagement of the plunger with the electrical contact will signal the machine control that a lead wire is in position in the head assembly and that the head assembly should continue to operate. The ball plunger is threaded into the carrier to permit adjustment of the ball carrier-contact position. This permits the sensor to be fine tuned to compensate for variations in the assembled dimensions of the electrical contact, carrier and ball plunger and thereby prolong the life of the sensor.

DESCRIPTION OF THE PREFERRED EMBODIMENT

The cut-clinch head assembly of this invention is adapted to be positioned below a printed circuit board in an automatic axial lead component assembly machine. The general environment for the application of this cut-clinch head assembly is illustrated in U.S. Pat. No. 4,080,730. As shown in that patent there are two opposed, right-hand and left-hand, cut-clinch head assemblies, each of which cut and clinch a component lead wire extending down through the board from opposite ends of the axial lead component. In this application, only one head assembly 10 (left-hand) is described in detail since both right and left head assemblies are identical. The head assembly 10 is adapted to be mounted on a support (not shown) to be positioned beneath a printed circuit board.

Figure 1:
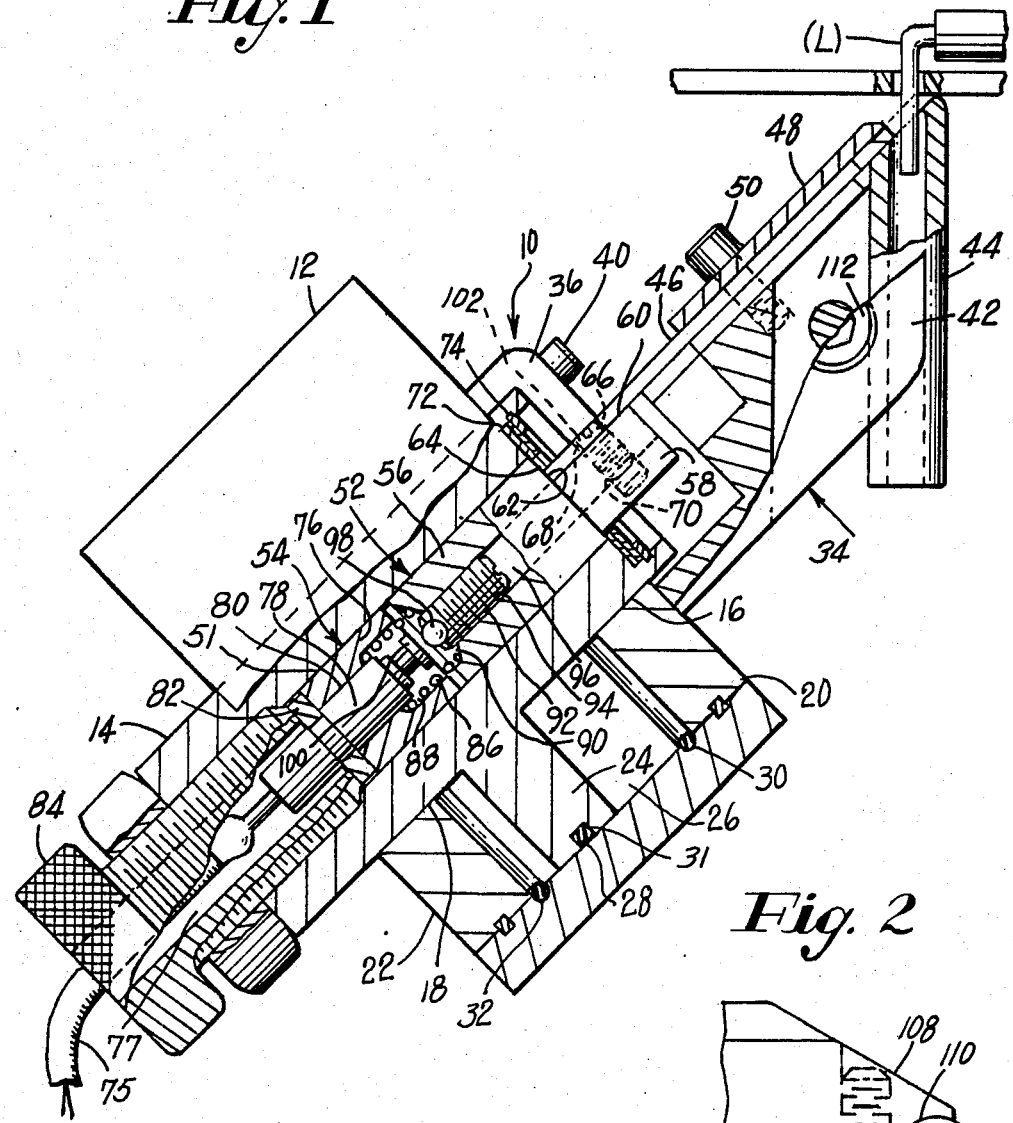
FIG. 1 is a side view, partially in section, of one of the cut-clinch head assemblies.

Attention is now directed to FIG. 1 wherein the head assembly 10 comprises a pneumatically operated cylinder 12 carrying a piston 14. The piston 14 is positioned through annular openings 16, 18 in the end plates 20, 22 of the cylinder 12. The piston 14 has an annular flange 24 received in the operating chamber 26 of the cylinder 12. An annular seal 28 rides in the groove 31 in flange 24 to seal the flange in the chamber 26. Seals 30, 32 are positioned between the end plates 20,22 of the cylinder 12 to seal the operating chamber 26. Thus, it can be seen that air introduced into the operating chamber 26 on either side of flange 24 will move the piston 14 back and forth in the cylinder 12.

Figure 3:
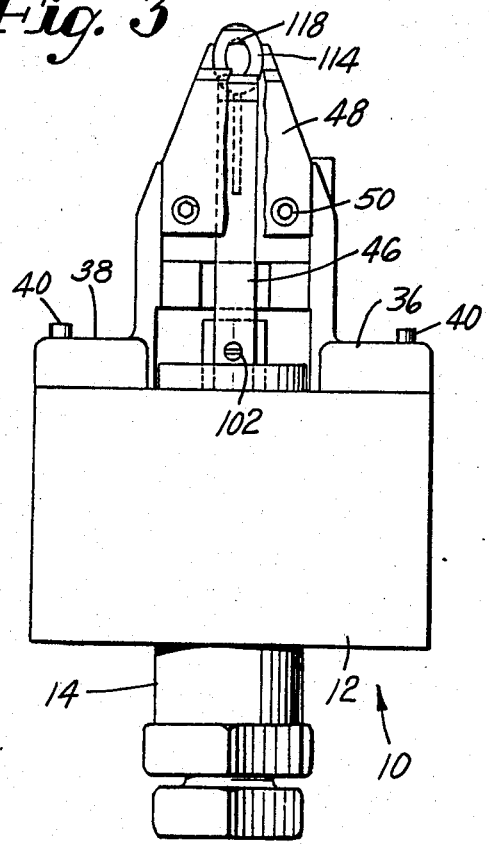
FIG. 3 is a top plan view illustrating the movable knife in retacted position.
Figure 4:
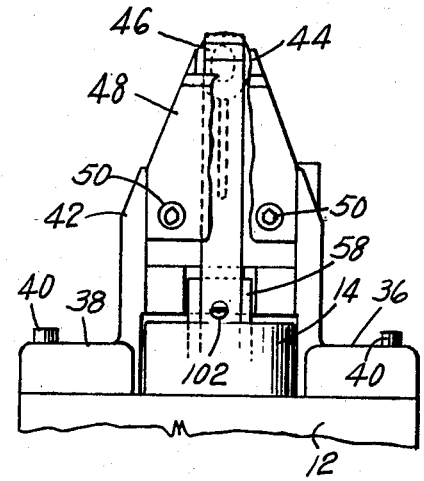
FIG. 4 is a top plan view illustrating the movable knife in the extended position during the cut-clinch operation.

Mounted on the forward end plate 20 of cylinder 12 is a nose block 34. The block 34, has legs 36,38 (see FIG. 3) secured to the end plate 20 by screws 40. A forward extension 42 of block 34 carries a fixed knife 44 and a movable knife 46. A knife retainer 48 is fastened over the movable knife by screws 50.

The piston 14 has a cylindrical axial opening 51 housing the movable knife carrier 52 and the sensing mechanism 54. The knife carrier 52 is a cylindrical plug 56 slidably disposed in opening 51. The plug 56 has a reduced extension 58 with a flat upper surface 60 upon which the knife 46 is positioned. The rear shoulder 62 of the knife 46 is positioned against the shoulder 64 of the extension 58. A set screw 66 passes through the opening 68 in knife 46 and is threaded into the opening 70 in extension 58.

The shoulder 64 of the plug 56 rests against washers 72 retained in the end of piston 14 by retaining ring 74.

The sensor 54 comprises a guide bushing 76 disposed in the axial opening 51. An insulated electrical contact 78 is disposed in opening 80 in the guide bushing 76. A washer 82 surrounds contact 78 and is positioned in the axial opening 51 by the screw 84. The washer 82 also contacts the rear of guide bushing 76 to retain the bushing 76 in opening 51. The wire 75 from contact 78 passes through the opening 77 in screw 84.

A compression spring 86 is received between the recess 88 in the bushing 76 and the recess 90 in the plug 56. A ball plunger 92 has a body portion 94 threaded into the opening 96 in the carrier 52. The body portion 94 of ball plunger 92 carries a ball contact 98.

In the operation of the cut-clinch head assembly thus far described, air introduced into the operating chamber 26 on the back side of flange 24 will cause the piston 14 to move upwardly. This moves knife 46 toward the fixed knife 44. If a component lead wire (L) is positioned down through the fixed knife 44 as illustrated in FIG. 1, as the movable knife contacts the lead, the resistance to further movement will cause the spring 86 to be compressed as the piston 14 moves upward. This causes the ball contact 98 on plunger 92 to engage the forward end 100 of insulated electrical contact 78. This senses that the component lead is in proper position and signals the machine control that the mechanism can continue to operate. Further movement of knife 46 will cut and clinch the lead wire.

If on the other hand, the component lead is not received in the fixed knife (due to for example, the lead being bent or not actually being positioned through the opening in the board), there would be no resistance to the movement of the knife 46. Thus, there would be no force against the compression spring 86 and the contacts 98, 100 would not engage. This condition would signal the machine control to prevent further operation until the fault was corrected.

Since the ball plunger 92 is threaded into the opening 96 of plug 56, the contacts 98, 100 can be slightly moved toward or away from one another to fine tune the sensing mechanism. Access to the ball plunger 92 for adjustment purposes is accomplished by removing screws 40 and blocks 34. This exposes the end of opening 96. After removal of the set screw 66 from opening 70, a tool can be inserted in opening 96 to adjust ball plunger 92. For example, turning ball plunger 92 into the opening 96 will move contacts 98,100 closer together. Likewise, the contacts 98,100 can be moved apart by turning ball plunger outwardly. In the machine set up, the fine tuning is accomplished by moving carrier 56 toward guide bushing 76 until these members contact one another. Thereafter the ball plunger is threaded inwardly until the contact 98 just meets contact 100 and the machine control indicates that such contact has been made. This provides a finite touch contact engagement of the contacts 98,100 to assure a minimum of contact force at the time the sensor is energized to prolong the life of the sensor while maintaining the reliability of the function of the sensor.

In a cut-clinch mechanism for cutting and forming components leads, after an extended period of use the cutting edge of both the fixed and movable knife will wear. Thus, it is desirable to be able to quickly and efficiently remove the knives for either sharpening or replacement. It is particularly desirable to be able to remove the knives without removing any other operating portions of the mechanism or even removing any fastening means that could be lost or misplaced while this maintenance procedure is taking place.

Figure 2:
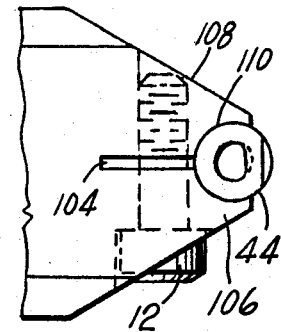
FIG. 2 is a top plan view of the mounting for the fixed knife.
Figure 5:
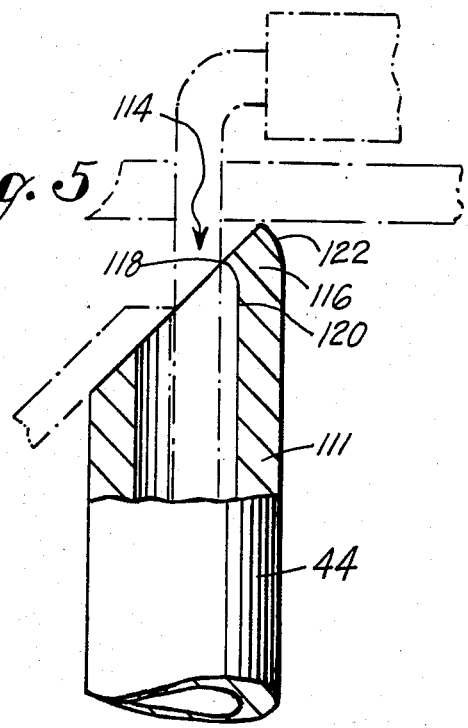
FIG. 5 is an enlarged view of the end of the fixed knife.

Attention is directed to FIGS. 1, 2 and 5 which illustate the efficient fashion in which the knives 44 and 46 can be removed from the head assembly for servicing. As previously mentioned, the movable knife 46 is retained on the extension 58 of carrier 52 by a set screw 66. The threaded opening 70 in extension 58 is greater in depth than the length of set screw 66. To remove the knife 46, the operator merely turns the set screw 66 into the opening 70 until the screw head 102 extends below the surface of the opening 68 in knife 46. Thereafter, the knife 46 can be slid out of the head past the end of the fixed knife 44. To replace the knife 46, the knife can be slid back into the head assembly and the set screw 66 turned outwardly back into the opening 68 in the knife to lock the knife to the carrier 52. In this fashion, the knife 46 can be easily removed from the head assembly for servicing without the removal of any other parts of the head assembly.

Attention is now directed to FIGS. 1 and 2 which illustrate the novel manner of removing the fixed knife 44 from the head assembly for servicing or replacement. The nose block 34 is bifurcated at 104 into two segments 106, 108. At the end of the nose block 34 is a cylindrical opening 110 which receives the cylindrical body of the fixed knife 44. A threaded fastener 112 is secured through segment 106 and is threaded into segment 108. After the fixed knife is inserted into the opening 110, the fastener 112 can be tightened to close the segments 106,108 and secure the knife in the opening 110. To service the knife 44, loosening the fastener 112 will permit removal of the knife 44 from the head assembly. Again, as with the movable knife 46, the fixed knife 44 can be removed without removing any other parts of the head assembly.

Attention is now directed to FIGS. 1, 2 and 5 which illustrate the novel cutting edge portion of the fixed knife that assures a good cutting action on the lead wire and provides a longer cutting edge life for the fixed knife.

The fixed knife 44 is comprised of a tubular member 111 adapted to receive the component lead (L), as illustrated in FIG. 1. The end portion 114 of the tube is cut at an angle to the axis of the tube. This permits the angularly disposed movable knife 46 to act at an angle to the lead wire to facilitate the cutting operation. The end portion 114 of the tube 111 has an outboard edge 116 against which the cutting action occurs. A cutting lip 118 is formed out of the surface 120 of the inside of the tube. This cutting lip 118 is formed by deforming the end 122 of the tube, as shown in FIG. 5. Thus, there has been provided a cutting lip 118 on the end of the fixed knife that will act against the lead wire in substantially the same angular direction as the movable knife during the lead cutting operation. This increases the efficiency of the cutting operation and substantially increases the operating life of the fixed knife.

It should also be noted that the tubular member 111 conveys the cut lead wire away from the operating parts of the head assembly. This assures that the removed wire will not effect the continued operation of the head assembly.

I claim:

1. A head assembly for cutting and clinching the lead wires of an electrical component which extend down through openings in a printed circuit board, comprising:
  a. a fixed knife mounted on the head assembly and adapted to be positioned below a printed circuit board to receive the lead wire extending through an opening in the board;
  b. a movable knife slidably mounted on said head assembly and adapted to be moved into cutting relationship with said fixed knife;
  c. drive means for moving said movable knife, including a piston having a central passageway with an opening toward said movable knife;
  d. a movable knife carrier slidably disposed in said passageway opening and having an opening disposed toward said movable knife;

e. a guide bushing positioned in said passageway and having a recess and an opening;

f. a compression spring positioned in said bushing recess and between said carrier and said guide bushing to bias said carrier away from said guide bushings;

g. electrical contact means positioned in said guide bushing opening and said carrier opening;

h. said carrier being movable by the movable knife when engaging the lead wire to compress said spring and engage said contact means to sense the presence of a lead wire;

i. said electrical contact means includes a ball plunger threaded into said carrier opening to close said carrier opening and encase said electrical contact means in said piston passageway, said ball plunger being accessible from the exterior of said head assembly and adjustable to vary the opening of said contact means.

2. The head assembly of claim 1 wherein said electrical contact means is located within said compression spring.

* * * * *